United States Patent
Huang et al.

(10) Patent No.: US 7,081,679 B2
(45) Date of Patent: Jul. 25, 2006

(54) STRUCTURE AND METHOD FOR REINFORCING A BOND PAD ON A CHIP

(75) Inventors: Tai-Chun Huang, Hsin-Chu (TW); Chih-Hsiang Yao, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 117 days.

(21) Appl. No.: 10/731,983

(22) Filed: Dec. 10, 2003

(65) Prior Publication Data

US 2005/0127529 A1    Jun. 16, 2005

(51) Int. Cl.
*H01L 23/48* (2006.01)
*H01L 23/52* (2006.01)
*H01L 29/40* (2006.01)

(52) U.S. Cl. .................. 257/779; 257/780; 257/781; 257/784

(58) Field of Classification Search ............... None
See application file for complete search history.

(56) References Cited

U.S. PATENT DOCUMENTS

| | | | | |
|---|---|---|---|---|
| 5,739,587 A | * | 4/1998 | Sato | 257/758 |
| 6,100,589 A | * | 8/2000 | Tanaka | 257/758 |
| 6,163,075 A | * | 12/2000 | Okushima | 257/759 |
| 6,297,563 B1 | * | 10/2001 | Yamaha | 257/781 |
| 6,306,749 B1 | * | 10/2001 | Lin | 438/612 |
| 6,313,024 B1 | * | 11/2001 | Cave et al. | 438/598 |
| 6,362,531 B1 | * | 3/2002 | Stamper et al. | 257/781 |
| 6,372,409 B1 | * | 4/2002 | Yu | 430/313 |
| 6,476,491 B1 | * | 11/2002 | Harada et al. | 257/758 |
| 6,657,302 B1 | * | 12/2003 | Shao et al. | 257/758 |
| 6,680,484 B1 | * | 1/2004 | Young | 257/48 |
| 6,710,448 B1 | * | 3/2004 | Wang | 257/758 |
| 6,740,985 B1 | * | 5/2004 | Zhao | 257/784 |
| 6,747,355 B1 | * | 6/2004 | Abiru et al. | 257/758 |
| 6,921,714 B1 | * | 7/2005 | Yamaha | 438/612 |
| 2004/0145045 A1 | * | 7/2004 | Huang et al. | 257/700 |
| 2004/0222530 A1 | * | 11/2004 | Shin | 257/758 |
| 2005/0067707 A1 | * | 3/2005 | Hashimoto et al. | 257/758 |

\* cited by examiner

*Primary Examiner*—David A. Zarneke
(74) *Attorney, Agent, or Firm*—Tung & Associates

(57) ABSTRACT

A structure for reinforcing or anchoring a bond pad on a chip. The structure includes a bonding pad provided in a dielectric layer, at least one conductive layer provided beneath and in electrical contact with the bonding pad, and at least one parallel-interconnect anchor structure provided in contact with the bonding pad and the conductive layer. The anchor structure or structures prevent the bonding pad from exerting excessive force against the dielectric layer and cracking the dielectric layer when the chip is subjected to physical testing. The bonding pad may have truncated or curved corners, for example.

20 Claims, 2 Drawing Sheets

STRUCTURE AND METHOD FOR REINFORCING A BOND PAD ON A CHIP

FIELD OF THE INVENTION

The present invention relates to packaging of semiconductor integrated circuits. More particularly, the present invention relates to a structure and method for reinforcing a bond pad on a chip in semiconductor packaging technology.

BACKGROUND OF THE INVENTION

One of the last processes in the production of semiconductor integrated circuits (IC) is multi-leveled packaging, which includes expanding the electrode pitch of the IC chips containing the circuits for subsequent levels of packaging; protecting the chip from mechanical and environmental stress; providing proper thermal paths for channeling heat dissipated by the chip; and forming electronic interconnections. The manner in which the IC chips are packaged dictates the overall cost, performance, and reliability of the packaged chips, as well as of the system in which the package is applied.

Package types for IC chips can be broadly classified into two groups: hermetic-ceramic packages and plastic packages. A chip packaged in a hermetic package is isolated from the ambient environment by a vacuum-tight enclosure. The package is typically ceramic and is utilized in high-performance applications. A chip packaged in a plastic package, on the other hand, is not completely isolated from the ambient environment because the package is composed of an epoxy-based resin. Consequently, ambient air is able to penetrate the package and adversely affect the chip over time. Recent advances in plastic packaging, however, has expanded their application and performance capability. Plastic packages are cost-effective due to the fact that the production process is typically facilitated by automated batch-handling.

A recent development in the packaging of IC chips is the ball grid array (BGA) package, which may be utilized with either ceramic packages or plastic packages and involves different types of internal package structures. The BGA package uses multiple solder balls or bumps for electrical and mechanical interconnection of IC chips to other microelectronic devices. The solder bumps serve to both secure the IC chip to a circuit board and electrically interconnect the chip circuitry to a conductor pattern formed on the circuit board. The BGA technique is included under a broader connection technology known as "Controlled Collapse Chip Connection-C4" or "flip-chip" technology.

Flip chip technology can be used in conjunction with a variety of circuit board types, including ceramic substrates, printed wiring boards, flexible circuits, and silicon substrates. The solder bumps are typically located at the perimeter of the flip chip on electrically conductive bond pads that are electrically interconnected with the circuitry on the flip chip. Because of the numerous functions typically performed by the microcircuitry of a flip chip, a relatively large number of solder bumps are often required. The size of a flip chip is typically on the order of about thirteen millimeters per side, resulting in crowding of the solder bumps along the perimeter of the flip chip. Consequently, flip chip conductor patterns are typically composed of numerous individual conductors that are often spaced apart about 0.1 millimeter or less.

Wirebonding is the most common technique for establishing electrical connection between the bonding pads on the surface of a chip or die and the inner lead terminals, or posts, on the leadframe or substrate. A section of a typical conventional wirebonded chip 26 is shown schemalically in FIG. 1 and may include multiple wire bonding balls 10, each of which is directly bonded to the continuous upper surface of a bonding pad 14, typically rectangular in configuration, as shown in FIG. 2, and partially covered by a passivation layer 12. A pad opening 13 in the passivation layer 12 exposes the bonding pad 14, through which pad opening 13 the bonding ball 10 extends. The bondinq pad 14 is surrounded by a dielectric layer 15 such as an oxide in the chip 26. As further shown in FIG 1, the bonding pad 14 is provided in electrical contact with an upper conductive layer 16, which is separated from an underlying conductive layer 22 by an insulatlve layer 18. The conductive layers 16, 22 are disposed in electrical contact with each other through conductive vias 20 that extend through the insulative layers 18. The various insulative layers 18 and conductive layers 22 are sequentially deposited on a silicon substrate 24 throughout semiconductor fabrication, in conventional fashion. Each bonding ball 10 connects a bonding wire 11 through a lead to the terminals (not shown) on a leadframe.

The bonding pads 14 are typically arranged in rows which extend adjacent to respective edges of the chip 26. Prior to packaging and formation of the bonding balls 10 on the respective bonding pads 14, the chip 26 is subjected to parametric testing which utilizes test structures to assess the electrical characteristics and reliability of the devices on the wafer. Probe cards are typically used as an interface between the devices on the chip and automated test equipment. The probe card typically includes a printed circuit board from which extends multiple probe needles (not shown), each of which is disposed in electrical contact with the device through the respective bonding pads 14. Each probe needle typically contacts the approximate center of the bonding pad 14 at a pressure of typically about 2–3 grams. Consequently, the probe needle typically forms a scrub mark (not shown) in the center of the bonding pad 14.

After the chip 26 is subjected to parametric testing, the wire bonding balls 10 are formed on the respective bonding pads 14 and a bonding wire 11 is bonded to each bonding ball 10, as shown in FIG. 1. Alternatively, each bonding wire 11 may be bonded directly to the surface of each bonding pad 14. The chip 26 may then be subjected to physical pressure tests in which shear and other forces are applied to the bonding wire 11 and bonding pad 14. One of the problems which typically occurs during such testing is that each bonding pad 14 tends to exert pressure against the adjacent dielectric layer 15, frequently forming a crack 17 or otherwise damaging the dielectric layer 15 in the region surrounding the bonding pad 14, as shown in FIG. 3. Moreover, upon application of a lifting force to the bonding wire 11, the bonding pad 14 may be pulled out of the dielectric layer 15. With the interconnect dimensions of VLSI devices scaling down to submicron levels, dielectric layers are increasingly being formed using low-k dielectric materials, which are characterized by weaker mechanical and physical properties than materials having a higher dielectric constant. Accordingly, various methods have been used to reinforce the bonding pads 14 in the dielectric layer 15 to prevent or minimize damage to the dielectric layer 15 and prevent the bonding pads 14 from being inadvertently pulled out of the dielectric layer 15 during physical testing of the chip 26.

FIG. 4 illustrates a conventional wirebonded chip 32 in which a bonding wire 30 has been bonded to a bonding pad 31 in a dielectric layer 34 using a thermosonic ball bond 28. Multiple conductive layers 36 are separated from each other by insulative layers 38, and the conductive layers 36 are connected to each other and to the bonding pad 31 through vias 40 which extend through the insulative layers 38. As shown in FIG. 4, one conventional method of reducing or eliminating damage to the dielectric layer 34 and lift-off of the bonding pad 31 during physical testing of the chip 32 includes providing a metal anchor pad 42 in the dielectric layer 34, in spaced-apart relationship to each bonding pad 31, and connecting the anchor pad 42 to the bonding pad 31 through a metal bridge 44. Accordingly, a portion of the stress which is applied to the dielectric layer 34 and to the bonding pad 31 is absorbed by the anchor pad 42 and the anchor bridge 44. Another method involves attaching the thermosonic ball bond 28 of the bonding wire 30 to the anchor pad 32 rather than to the bonding pad 31. While these methods are somewhat effective in preventing damage to the chip 32 during testing thereof, the dielectric layer 34, particularly if it has a low dielectric constant, still has a tendency to crack frequently during such testing. Accordingly, a new and improved structure and method is needed for preventing damage to a wire-bonded chip during physical testing of the chip.

An object of the present invention to provide a new and improved structure and method for reinforcing or anchoring a bonding pad in a dielectric layer.

Another object of the present invention is to provide a new and improved structure and method which prevents cracking of a dielectric layer during testing of a chip.

Still another object of the present invention is to provide a structure and method which is applicable to wire-bonded chips.

Another object of the present invention is to provide a new and improved, parallel interconnect structure for stabilizing or anchoring a bonding pad in a dielectric layer on a chip.

Yet another object of the present invention is to provide a structure and method which enhances the structural and functional integrity of a chip.

A still further object of the present invention is to provide a new and improved method which prevents bonding pads from being inadvertently pulled from a dielectric layer during testing of wire-bonded chips.

Yet another object of the present invention is to provide a new and improved bonding pad structure which includes a bonding pad provided in a dielectric layer, at least one conductive layer provided in electrical contact with the bonding pad, and an anchor structure contacting the bonding pad and the conductive layer for anchoring and reinforcing the bonding pad in the dielectric layer.

A still further object of the present invention is to provide a new and improved structure and method which is applicable to flip-chip packaging technology.

SUMMARY OF THE INVENTION

In accordance with these and other objects and advantages, the present invention is generally directed to a new and improved structure for reinforcing or anchoring a bond pad on a chip. The structure includes a bonding pad provided in a dielectric layer, at least one conductive layer provided beneath and in electrical contact with the bonding pad, and at least one parallel-interconnect anchor structure provided in contact with the bonding pad and the conductive layer. The anchor structure or structures prevent the bonding pad from exerting excessive force against the dielectric layer and cracking the dielectric layer when the chip is subjected to physical testing. The bonding pad may have truncated or curved corners, for example.

The anchor structure may include a bonding pad anchor pad which is provided in the dielectric layer and is joined to the bonding pad through a bonding pad bridge. Conductive layer anchor pads of the anchor structure are joined to the respective conductive layers beneath the bonding pad through respective conductive layer bridges. The conductive layer anchor pads may be joined to each other and to the bonding pad anchor pad through anchor vias.

The present invention further includes a method for reinforcing or anchoring a bonding pad in a dielectric layer on a chip. The method includes providing a bonding pad anchor pad in spaced-apart, adjacent relationship to the bonding pad; providing a bonding pad bridge between the anchor pad and the bonding pad anchor pad; providing a conductive layer anchor pad in spaced-apart, adjacent relationship to each of the conductive layers beneath the bonding pad; and providing a conductive layer bridge between each conductive layer and the corresponding conductive layer anchor pad.

BRIEF DESCRIPTION OF THE DRAWINGS

The invention will now be described, by way of example, with reference to the accompanying drawings, in which.

DESCRIPTION OF THE PREFERRED EMBODIMENTS

The present invention has particularly beneficial utility in the reinforcement of a bonding pad in a dielectric layer in the wire bonding packaging of integrated circuit chips. However, the invention is also applicable to "flip-chip" and other packaging technologies used in the packaging of integrated circuit chips.

Figure 1:
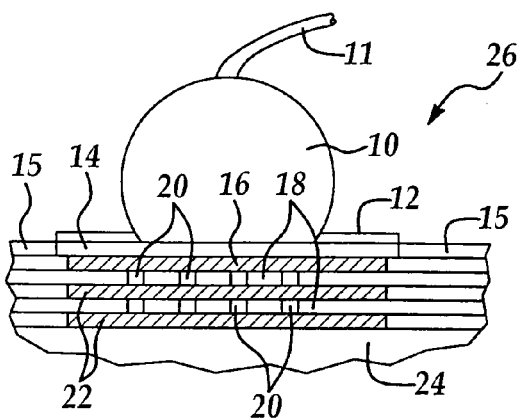
FIG. 1 is a cross-sectional view of a section of a typical conventional wirebonded chip.
Figure 2:
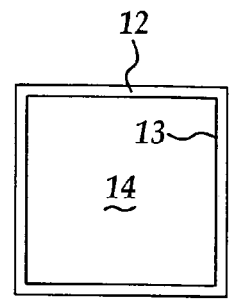
FIG. 2 is a top view of a bonding pad on a typical conventional wirebonded chip.
Figure 3:
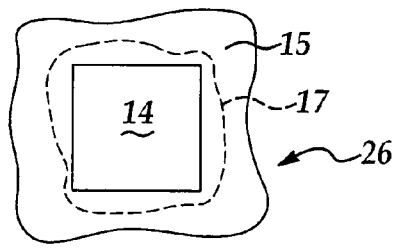
FIG. 3 is a top view of a bonding pad on a conventional wirebonded chip, illustrating a crack surrounding the bonding pad in a dielectric layer on the chip.
Figure 4:
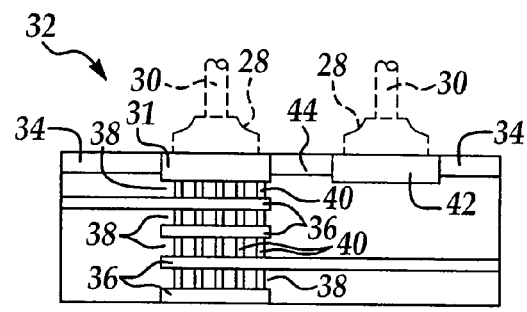
FIG. 4 is a cross-sectional view of a section of a conventional wirebonded chip, illustrating a conventional technique for reducing stress applied to the dielectric layer during physical testing of the chip.
Figure 5:
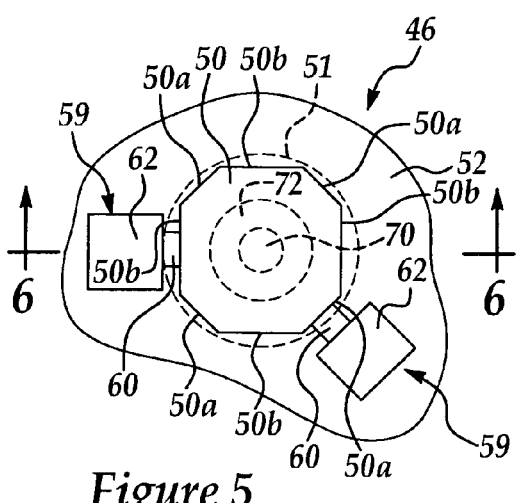
FIG. 5 is a top view of a bonding pad on a section of a wirebonded chip, with two anchor structures provided in contact with the bonding pad in implementation of one embodiment of the present invention.
Figure 6:
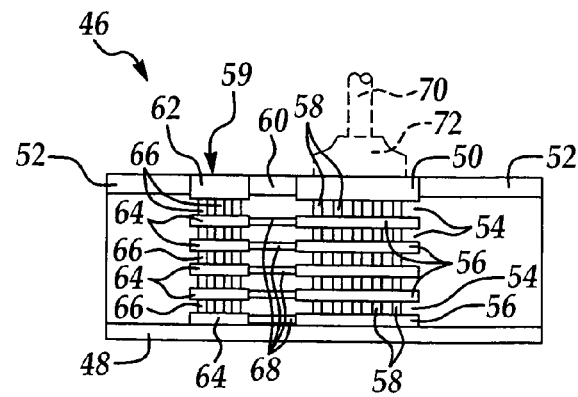
FIG. 6 is a cross-sectional view taken along section lines 6—6 in FIG. 5.

Referring initially to FIGS. 5 and 6, a section of a wirebonded chip 46 in accordance with the present invention includes a typically silicon substrate 48 on which is sequentially deposited conductive layers 56 and insulative layers 54 in alternating fashion, as shown in FIG. 6. A top dielectric layer 52 is the uppermost layer on the chip 46. The top dielectric layer 52, the insulative layers 54 and the conductive layers 56 may be deposited on the substrate 48 using chemical vapor deposition (CVD) techniques, as is well-known by those skilled in the art. Conductive vias 58 extend through the insulative layers 54 to establish electrical contact between adjacent conductive layers 56 in the chip 46. A bonding pad 50, which may be aluminum, copper or other electrically-conductive material, is provided in the dielectric layer 52. Accordingly, the bonding pad 50, together with the conductive layers 56 and conductive vias 58, define the integrated circuits in the chip 46. In the completely-assembled and packaged chip 46, electrical current is passed to the bonding pad 50, conductive vias 58 and conductive layers 56 from a substrate or leadframe (not shown) through a bonding wire 70 and typically through a thermosonic bond 72 to impart functionality to the chip 46.

In accordance with the present invention, as the conductive layers 56 and insulative layers 54 are sequentially deposited on the substrate 48 and on each other in alternating fashion, at least one, and typically multiple, parallel-interconnect anchor structures 59 are in like manner sequentially fabricated on the substrate 48 to anchor the bonding pad 50 in the dielectric layer 52. Each of the anchor structures 59 includes multiple conductive layer anchor pads 64 which are sequentially deposited on the insulative layers 54 alongside and in spaced-apart relationship to the respective conductive layers 56. A bonding pad anchor pad 62 of the anchor structure 59 is formed in the top dielectric layer 52, alongside and in spaced-apart relationship to the bonding pad 50. As the conductive layer anchor pads 64 are sequentially deposited on the insulative layers 54 alongside the respective conductive layers 56, a conductive layer bridge 68 is also deposited on each insulative layer 54 and connects each conductive layer anchor pad 64 of the anchor structure 59 to the corresponding adjacent conductive layer 56. A bonding pad bridge 60 is provided in the top dielectric layer 52 and connects the bonding pad 50 to the bonding pad anchor pad 62. Multiple anchor vias 66 typically extend between the adjacent conductive layer anchor pads 64.

As shown in FIG. 5, in a preferred embodiment the bonding pad 50 has a generally octagon-shaped configuration, with truncated corners 50a and flat edges 50b. However, it is understood that the bonding pad 50 may have alternative shapes. The truncated corners 50a eliminate sharp corners from the bonding pad 50 which would otherwise present excessive shear stress against the top dielectric layer 52 during physical testing of the chip 46, thus imparting additional structural and functional integrity to the chip 46.

Typically, multiple anchor structures 59 are provided in the chip 46, with one bonding pad bridge 60 connecting a first anchor structure 59 to a flat edge 50b of the bonding pad 50 and another bonding pad bridge 60 connecting another anchor structure 59 to a truncated corner 50a of the bonding pad 50. However, both of the anchor structures 59 may contact different truncated corners 50a or flat edges 50b, as desired. Furthermore, the chip 46 may include more than two of the anchor structures 59 provided at selected locations around the bonding pad 50. As shown in FIG. 5, each bonding pad bridge 60 typically forms a "neck" shaped structure with the connecting bonding pad anchor pad 62 of the corresponding anchor structure 59.

As further shown in FIG. 5, an imaginary crack zone circle 51 (shown in phantom) which corresponds to a "crack zone" within which the top dielectric layer 52 is most vulnerable to cracking, circumscribes and contacts all of the corners of the bonding pad 50. In a preferred embodiment, each anchor structure 59 including the bonding pad anchor pad 62; the underlying conductive layer anchor pads 64; and the anchor vias 66, lies outside the imaginary crack zone circle 51. Each anchor structure 59 is typically copper, aluminum or any other electrically-conductive metal.

After the chip 46 with the anchor structures 59 and the bonding pad 50 is fabricated in the manner heretofore described, the bonding wire 70 is attached to the upper surface of the bonding pad 50 typically using a thermosonic bond 72 for example, as shown, or any suitable alternative wirebonding technique. The chip 46 may then be subjected to physical tests to determine the structural and functional integrity of the chip 46. Accordingly, much of the shear and other stress applied to the bonding pad 50 is distributed to the parallel interconnect anchor structure or structures 59, such that the bonding pad bridge 60, the bonding pad anchor pad 62, the conductive layer anchor pads 64 and the anchor vias 66 absorb much of the stress and thus prevent excessive stress from being exerted on the relatively fragile top dielectric layer 52. Furthermore, the anchor structure or structures 59 reduce the tendency of the bonding pad 50 to peel or become dislodged from the top dielectric layer 52. Consequently, the chip 46 is characterized by enhanced functional and structural integrity and the top dielectric layer 52 is unlikely to be cracked or otherwise damaged during testing or during normal use of the electronic apparatus of which the chip 46 is a part.

Figure 10:
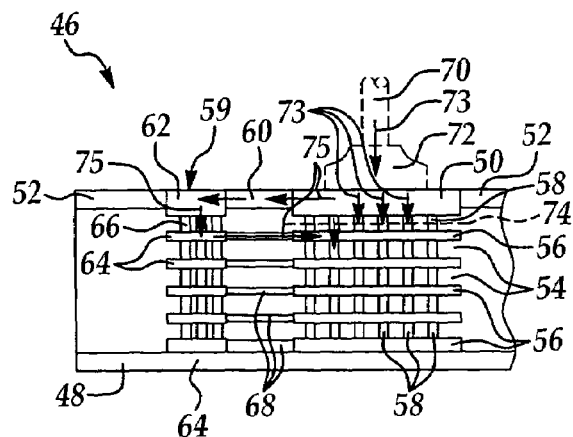
FIG. 10 is a cross-sectional view taken along section lines 6—6 in FIG. 5, illustrating a backup circuit defined by an anchor structure of a wirebonded chip according to the present invention.

Referring next to FIG. 10, during operation of an electronic device (not shown) of which the wirebonded chip 46 is a part, reference numeral 73 indicates the circuit path of normal current flow. Accordingly, the current normally flows through the bonding wire 70; the thermosonic bond 72; the bonding pad 50; and through the conductive vias 58 and underlying conductive layers 56, respectively. However, during packaging or testing, for example, of the wirebonded chip 46, one or more sets of conductive vias 58 between the bonding pad 50 and the adjacently underlying conductive layer 56, or between one conductive layer 56 and the next lowest conductive layer 56, may be inadvertently broken or severed.

In FIG. 10, a dashed break line 74 indicates inadvertent severing or breaking of the conductive vias 58 which normally establish electrical conduction between the bonding pad 50 and the underlying conductive layer 56. Accordingly, electrical current is no longer able to flow along the normal current flow pathway 73, since the path of electrical conduction between the bonding pad 50 and the adjacently underlying conductive layer 56 is interrupted. Therefore, the anchor structure 59, in conjunction with the bonding pad bridge 60 and underlying conductive layer bridge 68, provides a backup circuit for the wirebonded chip 46.

The backup circuit for the wirebonded chip 46 is indicated by a backup current flow pathway 75 in FIG. 10. Accordingly, the electrical current flows through the bonding wire 70; the thermosonic bond 72; the bonding pad 50; the bonding pad bridge 60; the bonding pad anchor pad 62 of the anchor structure 59; the anchor vias 66; the adjacently underlying conductive layer anchor pad 64; the conductive layer bridge 68 of the anchor structure 59; and to the conductive layer 56, respectively. In this manner, the severing or breaking of the conductive vias 58 between the bonding pad 50 and the adjacently underlying conductive layer 56, is circumvented. In similar fashion, the anchor structure 59, in conjunction with the bonding pad bridge 60, provides a backup circuit at each level in the wirebonded chip 46, in the event that any of the conductive vias 58 between adjacent conductive layers 56 is inadvertently severed or broken.

Figure 7:
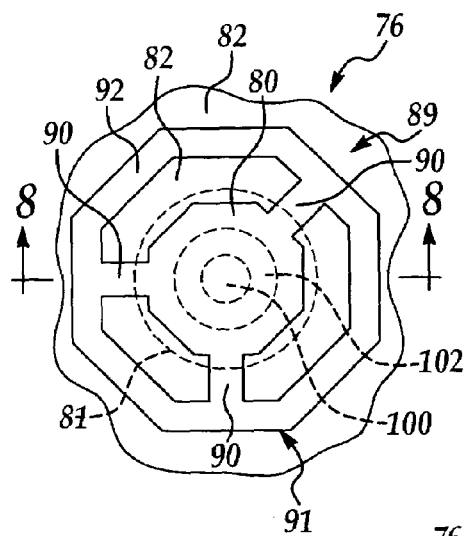
FIG. 7 is a top view of a bonding pad on a section of a wirebonded chip, with a continuous anchor structure provided in contact with the bonding pad in implementation of another embodiment of the present invention.
Figure 8:
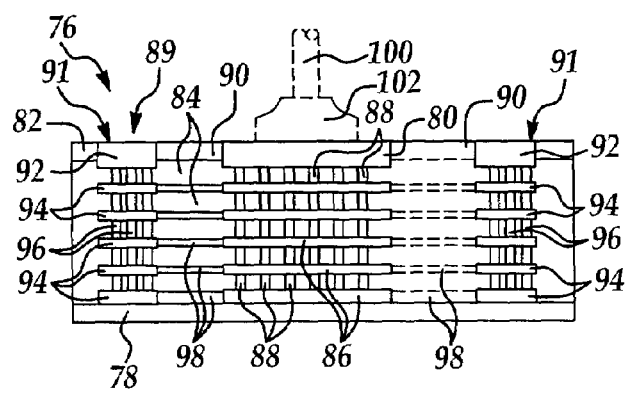
FIG. 8 is a cross-sectional view taken along section lines 8—8 in FIG. 7.

Referring next to FIGS. 7 and 8, in another embodiment a section of a wirebonded chip 76 in accordance with the present invention includes a typically silicon substrate 78 on which is sequentially deposited conductive layers 86 and insulative layers 84 in alternating fashion, as shown in FIG. 8. A top dielectric layer 82 is the uppermost layer on the chip 76. Conductive vias 88 extending through the insulative layers 84 establish electrical contact between adjacent conductive layers 86 in the chip 76. A typically aluminum, copper or other electrically-conductive metal bonding pad 80 is provided in the top dielectric layer 82. In the completely-assembled and packaged chip 76, a bonding wire 100 is attached to the surface of the bonding pad 80 typically using a thermosonic bond 102 or other technique known by those skilled in the art.

In accordance with the present invention, as the conductive layers 86 and insulative layers 84 are sequentially deposited on the substrate 78, an anchor structure 89 is sequentially fabricated on the substrate 78 to anchor the bonding pad 80 in the top dielectric layer 82. As shown in FIG. 7, the anchor structure 89 includes a continuous anchor ring 91 which is typically shaped in the configuration of an octagon and completely surrounds the typically octagon-shaped bonding pad 80. The anchor ring 91 has a width of typically about 10 μm. At least one, and typically multiple, bonding pad bridges 90 connect the bonding pad 80 to a bonding pad anchor pad 92, which corresponds to the uppermost level of the anchor ring 91 in the chip 76. As shown in FIG. 8, the anchor ring 91 further includes multiple conductive layer anchor pads 94 which lie beneath the bonding pad anchor pad 92 and are sequentially deposited on the insulative layers 84 alongside and in spaced-apart relationship to the respective conductive layers 86. As the conductive layer anchor pads 94 of the anchor ring 91 are sequentially deposited on the insulative layers 84 alongside the conductive layers 86, a conductive layer bridge 98 is also deposited on each insulative layer 84 and connects each conductive layer anchor pad 94 to the corresponding adjacent conductive layer 86. Thus, a set of the conductive layer bridges 98 lies beneath each bonding pad bridge 90, which is provided in the top dielectric layer 82 and connects the bonding pad 80 to the bonding pad anchor pad 92. Multiple anchor vias 96 typically extend between the adjacent conductive layer anchor pads 94. As further shown in FIG. 7, in a preferred embodiment the anchor ring 91, which includes the bonding pad anchor pad 92; the conductive layer anchor pads 94; and the anchor vias 96, lies outside an imaginary crack zone circle 81 which circumscribes the bonding pad 80.

After the chip 76 with the anchor structure 89 and the bonding pad 80 is fabricated in the manner heretofore described, the bonding wire 100 is attached to the upper surface of the bonding pad 80 typically using a thermosonic bond 102 for example, as shown, or any suitable alternative wirebonding technique. The chip 76 may then be subjected to physical tests to determine the structural and functional integrity of the chip 76. Accordingly, much of the shear and other stress applied to the bonding pad 80 is distributed to the anchor structure 89, such that the bonding pad bridges 90 and the bonding pad anchor pad 92, the conductive layer anchor pads 94 and the anchor vias 96 of the continuous anchor ring 91 absorb much of the stress and thus prevent excessive stress from being exerted on the relatively fragile top dielectric layer 82. Furthermore, the anchor structure 89 reduces the tendency of the bonding pad 80 to peel or become dislodged from the top dielectric layer 82. Consequently, the chip 76 is characterized by enhanced functional and structural integrity and the top dielectric layer 82 is unlikely to be cracked or otherwise damaged during testing or during normal use of the electronic apparatus of which the chip 76 is a part.

As heretofore described with respect to FIG. 10, the anchor structure 89 defines a backup circuit at each level of the wirebonded chip 76 in the event that the conductive vias 88 between the bonding pad 80 and the adjacently underlying conductive layer 86, or between the adjacent conductive layers 86, is inadvertently broken or severed.

Figure 9:
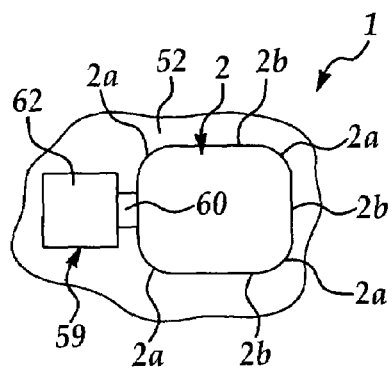
FIG. 9 is a top view of a bonding pad on a section of a wirebonded chip in implementation of the present invention, wherein the bonding pad has rounded corners.

Referring next to FIG. 9, in another embodiment of the chip 1 of the present invention, the bonding pad 2 has rounded corners 2a and flat edges 2b. One or more anchor structures 59 is provided in contact with the bonding pad 2 through a corresponding bonding pad bridge 60, as heretofore described with respect to the wirebonded chip 46 of FIGS. 5 and 6. The rounded corners 2a eliminate sharp corners from the bonding pad 2 which would otherwise present excessive shear stress against the top dielectric layer 52 during physical testing of the chip 1, thus imparting additional structural and functional integrity to the chip 1.

While the preferred embodiments of the invention have been described above, it will be recognized and understood that various modifications can be made in the invention and the appended claims are intended to cover all such modifications which may fall within the spirit and scope of the invention.

What is claimed is:

1. A structure for reinforcing a bonding pad following a bonding operation, said bonding pad connected to at least one underlying conductive layer on a substrate, comprising:
   at least one anchor structure disposed horizontally adjacent to said bonding pad and at least one conductive layer underlying said bonding pad, said at least one anchor structure interconnected to the bonding pad and to the at least one underlying conductive layer;
   wherein said bonding pad and said anchor structure are horizontally adjacently surrounded by a dielectric layer.

2. The structure of claim 1 wherein said at least one anchor structure further comprises a bonding pad anchor pad for connection interconnected to the bonding pad by a first conductive bridge, at least one conductive layer anchor pad underlying said bonding pad anchor pad and connected to the at least one conductive layer by a second conductive bridge; and
   wherein at least one anchor via connecting said connecting pad anchor pad to said conductive layer anchor pad.

3. The structure of claim 1 wherein said at least one anchor structure comprises a plurality of anchor structures each anchor structure disposed horizontally adjacent and interconnected to said bonding pad and said at least one underlying conductive layer, respectively.

4. The structure of claim 3 wherein said plurality of anchor structures comprises a bonding pad anchor pad interconnected to the bonding pad by a first conductive bridge, a conductive layer anchor pad connection interconnected to the conductive layer by a second conductive bridge, and at least one anchor via connecting said bonding pad anchor pad to said conductive layer anchor pad.

5. The structure of claim 1 wherein said at least one anchor structure lies outside an imaginary crack zone circle comprising said dielectric layer circumscribing said bonding pad.

6. The structure of claim 1, wherein the anchor structure has about the same dimensions with respect to an uppermost layer and underlying layers.

7. The structure of claim 1, wherein the bonding pad has truncated corners as viewed from the top.

8. The structure of claim 1, wherein the bonding pad has a rounded corners as viewed from the top.

9. A structure for reinforcing a bonding pad following a bonding operation, said bonding pad connected to a plurality of underlying conductive layer levels through a plurality of insulative layers disposed on a substrate, comprising:

at least one multi-layer level anchor structure disposed horizontally adjacent and interconnected to the bonding pad and to the conductive layers, said anchor structure and conductive layers interconnected by a conductor layer bridge extending between the anchor structure and a respective conductor layer at a respective level;

wherein the anchor structure at the uppermost level of said at least one multi-level anchor structure comprises a bonding pad anchor pad, said bonding pad anchor pad connected to said bonding pad by a bonding pad bridge extending between said bonding pad anchor pad and said bonding pad; and, wherein said bonding pad, said bonding pad anchor pad, and said bonding pad bridge are horizontally adjacently surrounded by an uppermost insulative layer.

10. The structure of claim 9 wherein said at least one multi-level anchor structure comprises a plurality of conductive layer anchor pads, each conductive layer anchor pad horizontally adjacent disposed at a respective level for connection to a respective conductive layer;

wherein at least one first anchor via connects said bonding pad anchor pad to to a first underlying conductive layer anchor pad, and at least one second anchor via connects each of said conductive layer anchor pads to a second underlying conductive layer anchor pads, respectively.

11. The structure of claim 9 wherein said at least one anchor structure comprises a plurality of anchor structures.

12. The structure of claim 9 wherein said at least one anchor structure lies outside an imaginary crack zone circle comprising said uppermost insulative layer circumscribing said bonding pad.

13. The structure of claim 9 wherein the anchor structure has about the same dimensions at a respective level.

14. The structure of claim 9, wherein the bonding pad has truncated corners as viewed from the top.

15. The structure of claim 9, wherein the bonding pad has a rounded corners as viewed from the top.

16. A method of reinforcing a bonding pad following a bonding operation, said bonding pad connected through conductive vias to a plurality of underlying conductive layers deposited on a substrate, comprising the step of:

forming at least one anchor structure disposed horizontally adjacent to said bonding pad and at least one conductive layer underlying said bonding pad, said at least one anchor structure formed interconnected to the bonding pad and to the at least one underlying conductive layer;

wherein said at least one anchor structure is formed horizontally interconnected by a respective conductor bridge extending between said anchor structure and said bonding pad and between said anchor structure said at least one conductor layer; and, wherein said anchor structure and said respective conductor bridges are horizontally adjacently surrounded by a dielectric layer including at an uppermost level.

17. The method of claim 16 wherein said at least one anchor structure comprises a plurality of anchor structures.

18. The method of claim 16 wherein the anchor structure is formed with about the same dimensions with respect to an uppermost layer and underlying layers.

19. The method of claim 16, wherein the bonding pad is formed with truncated corners as viewed from the top.

20. The method of claim 16, wherein the bonding pad is formed with rounded corners as viewed from the top.

* * * * *